United States Patent
Konda et al.

(10) Patent No.: US 7,379,837 B1
(45) Date of Patent: May 27, 2008

(54) METHOD AND SYSTEM FOR TESTING INTEGRATED CIRCUITS

(75) Inventors: Dharma R. Konda, Aliso Viejo, CA (US); Mohana S. Devarajan, Irvine, CA (US); Sanak H. Ream, Long Beach, CA (US)

(73) Assignee: Qlogic, Corporation, Aliso Viejo, CA (US)

( * ) Notice: Subject to any disclaimer, the term of this patent is extended or adjusted under 35 U.S.C. 154(b) by 0 days.

(21) Appl. No.: 11/491,357

(22) Filed: Jul. 21, 2006

(51) Int. Cl.
G06F 19/00 (2006.01)
G01R 31/26 (2006.01)

(52) U.S. Cl. .................................................. 702/117
(58) Field of Classification Search ................. 702/117
See application file for complete search history.

(56) References Cited

U.S. PATENT DOCUMENTS 6,693,436 B1* 2/2004 Nelson ......................... 324/537
6,980,943 B2* 12/2005 Aitken et al. ................. 703/14
7,260,493 B2* 8/2007 Laquai et al. ................ 702/117
2005/0229132 A1* 10/2005 Butt et al. .................... 716/10

OTHER PUBLICATIONS

Wikipedia, "Application Specific Integrated Circuit", Oct. 2007, pp. 1-7.*

* cited by examiner

Primary Examiner—John E. Barlow, Jr.
Assistant Examiner—Cindy H Khuu
(74) Attorney, Agent, or Firm—Klein, O'Neill & Singh, LLP; TJ Singh

(57) ABSTRACT

Method and system for testing application specific integrated circuit using a tester is provided. The method includes measuring output data timing values of the application specific integrated circuit with respect to a tester cycle in a first pass; measuring first strobe timing value and second strobe timing value with respect to the tester cycle in a second pass; and calculating data set-up timing values and data hold timing values with respect to the first strobe and the second strobe, using the output data timing values measured in the first pass and the first strobe timing value and second strobe timing value measured in the second pass. The tester includes an input vector generator that generates input data for the application specific integrated circuit that is coupled to a data processing unit that calculates data set-up timing values and data hold timing values.

12 Claims, 7 Drawing Sheets

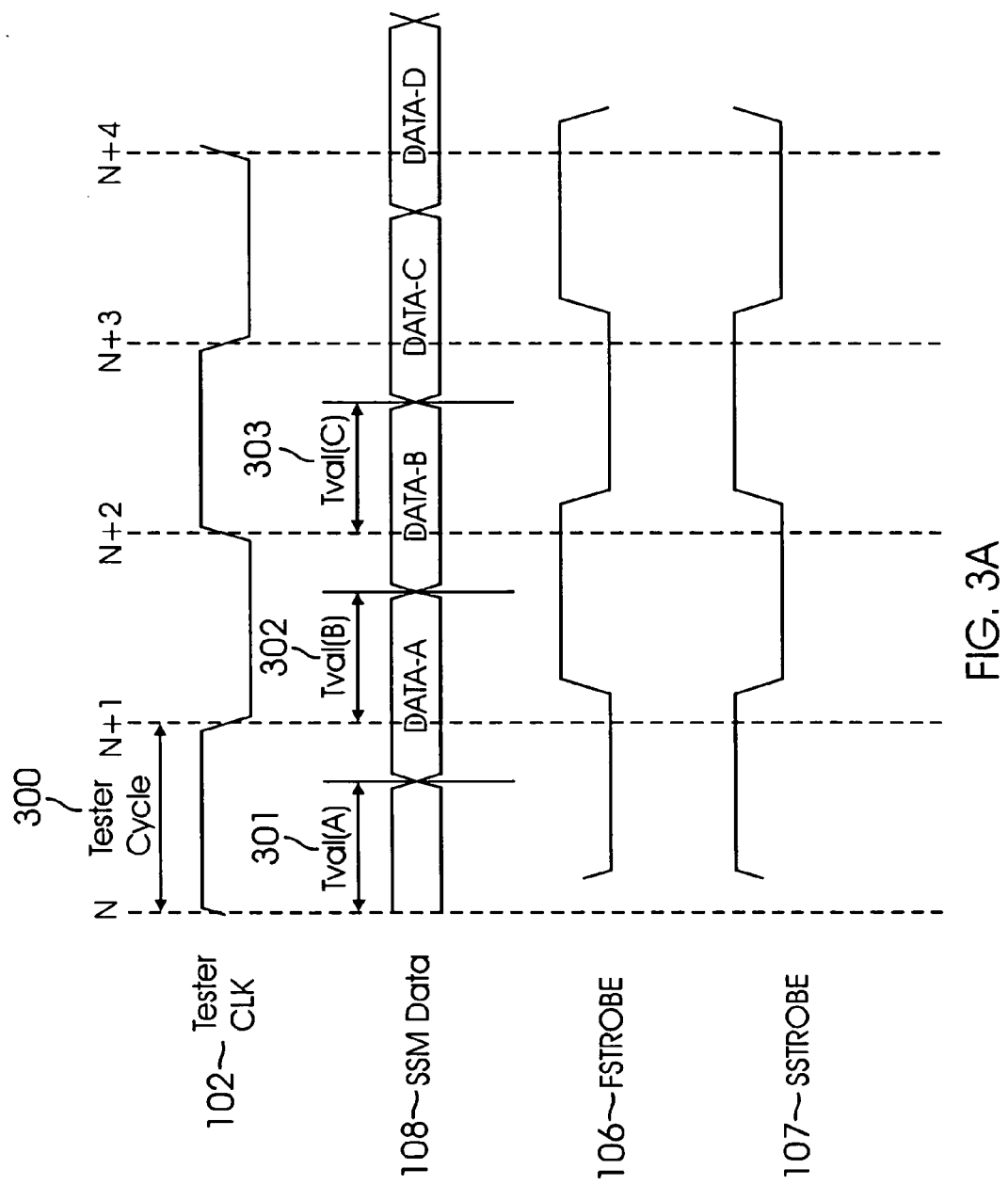

| FSSTROBE 107 | SSTORBE 108 | | SSM DATA 108 |
|---|---|---|---|
| | | | |
| CB/E[0]# | CB/E[1]# | | AD[15:0], PAR, ACK64#, REQ64# |
| CB/E[2]# | CB/E[3]# | | AD[31:16], ECC[5:2] |
| AD[49] | AD[8] 8] | | AD[47:32] |
| CB/E[6]# | C/BE[7]# | | AD[63:50],CB/E[4]#,CB/E[5]#, PAR64 |

FIG. 3D

METHOD AND SYSTEM FOR TESTING INTEGRATED CIRCUITS

BACKGROUND

1. Field of the Invention

This invention relates to testing systems, and more particularly, to testing PCI devices.

2. Background of the Invention

An Application Specific Integrated Circuit (ASIC) is used in various applications to perform certain logical functions. Before an ASIC is commercially made available, it is typically tested in a laboratory/manufacturing environment. A testing system (may also be referred to as "tester") is typically used to test ASIC functionality and logic therein. ASIC testing includes static measurements like voltage and current and dynamic measurements like timing and jitter.

Typical timing measurements include data set-up time and data hold time. Timing measurements use a reference signal, typically a clock, and a transition signal, typically data. A clock is a signal that has a repeating pattern of logic 1 (high voltage) for a period of half clock cycle and logic 0 (low voltage) for a period of half clock cycle. When a signal makes a transition from logic 0 to logic 1 then a positive edge is made. Similarly, when the signal makes a transition from logic 1 to logic 0 then a negative edge is made.

Data set-up time is defined as the amount of time a data signal is stable after a clock edge. Similarly, data hold time is defined as the amount of time a data signal is stable before a clock edge. The clock edge can be positive edge or negative edge.

In a PCI-X device, data set up and data hold values are measured with respect to a positive clock edge. A PCI-X device is one that complies with the PCI-X standard, and the standard is incorporated herein by reference in its entirety. An example of such a device is a host bus adapter that interfaces with a host computing system via a PCI-X bus.

In a conventional PCI-X device, output data transitions only once during a PCI-X clock cycle. A tester measures output data set-up timing and data hold timing on the fly with respect to the positive edge of the PCI-X clock.

PCI-X, version 2.0 is now commonly used as a bus standard for various devices, including HBAs. In a PCI-X 2.0 device, data transitions twice in a single clock cycle. Reference signals for a PCI-X 2.0 device are denoted as first strobe and second strobe signals. Output data set-up timing values and data hold timing values are defined with respect to the first strobe and second strobe signals. This method of transmitting output data with respect to other output signals, first strobe and second strobe, is called source synchronous mode (SSM). Conventional single tester cycle and a single tester pass are not adequate to measure the data set-up and data hold timing values in a PCI-X 2.0 device.

Therefore, what is needed is a method and system for measuring source synchronous mode (SSM) data set-up and data hold timing values.

SUMMARY OF THE INVENTION

In one aspect of the present invention, a method for testing an application specific integrated circuit is provided. The method includes measuring output data timing values of the application specific integrated circuit with respect to a tester cycle in a first pass; measuring first strobe timing value and second strobe timing value with respect to the tester cycle in a second pass; and calculating data set-up timing values and data hold timing values with respect to the first strobe and the second strobe, using the output data timing values measured in the first pass and the first strobe timing value and second strobe timing value measured in the second pass.

In another aspect of the present invention, a tester for testing an application specific integrated circuit is provided. The tester includes an input vector generator that generates input data for the application specific integrated circuit that is coupled to a data processing unit that measures output data timing values of the application specific integrated circuit with respect to a tester cycle in a first pass; and measures a first strobe timing value and a second strobe timing value with respect to the tester cycle in a second pass; and calculates data set-up timing values and data hold timing values with respect to the first strobe timing value and the second strobe timing value, using the data output timing measured in the first pass and the first strobe timing value and second strobe timing value measured in the second pass.

This brief summary has been provided so that the nature of the invention may be understood quickly. A more complete understanding of the invention can be obtained by reference to the following detailed description of the preferred embodiments thereof concerning the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures:

FIG. 3A, is a timing diagram of a PCI-X 2.0 device showing data timing values with respect to a tester clock, according to one aspect of the invention;

FIG. 3D shows a table showing PCI-X 2.0 values, used according to one aspect of the present invention

DETAILED DESCRIPTION OF THE PREFERRED EMBODIMENTS

To facilitate an understanding of the preferred embodiment, a testing system and process flow related to the testing system is described. The specific architecture and operation of the preferred embodiment will then be described with reference to the general description.

Figure 1:
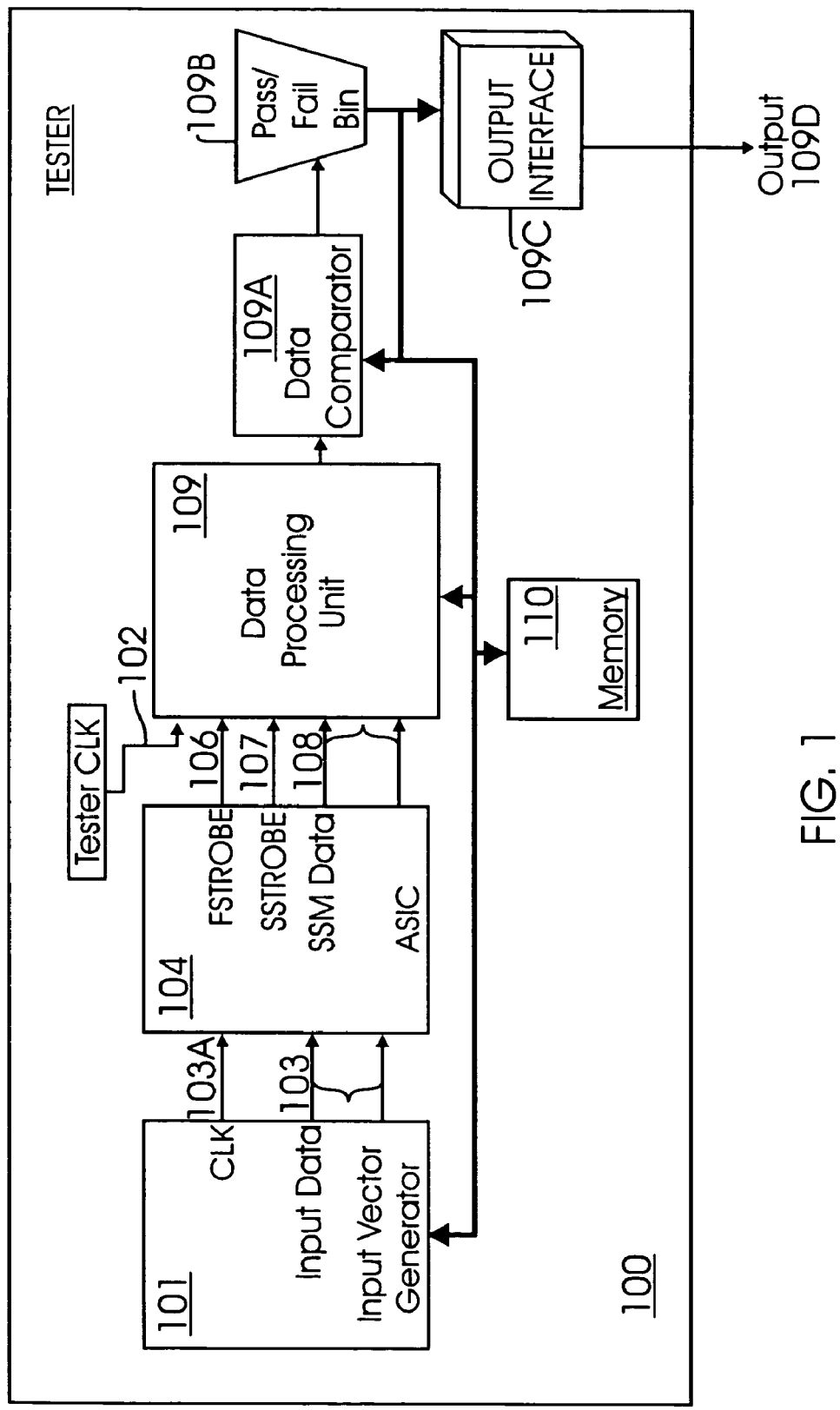
FIG. 1 shows a top-level system diagram of a tester used for measuring data set-up and data hold timing value, according to one aspect of the invention.

Tester:

FIG. 1 shows a top-level system diagram of a tester 100 used for measuring data set-up and data hold timing values for ASIC 104, according to one aspect of the invention. Tester 100 includes an input vector generator 101 that generates input data 103 and a clock 103A to an ASIC 104. ASIC 104 can be a PCI-X 2.0 device.

Data 103 is a test vector that is stored in tester memory 110. In one aspect, memory 110 is a non-volatile memory device.

ASIC 104 processes input data 103 and transmits output data 108, first strobe (FS) 106 and second strobe (SS) 107 to a data processing unit/module 109 (may also be referred to as module 109). Data processing unit 109 has a processor and other logic for performing the functions described below. In one aspect, data processing unit 109 can be a general-purpose computer.

Data processing unit 109 captures data transitions in two tester passes with respect to a tester clock 102 and stores them in memory 110. Module 109 also calculates data set-up and data hold timing values and forwards the results to a data comparator 109A. The details of the timing information and calculations are described below with respect to FIG. 2B, FIGS. 3A-3C.

Data comparator 109A reads pre-defined limits from memory 110 and compares the limits to the data received from data processing unit 109. The compared results are passed to a pass/fail bin (or logic) 109B, which records the pass/fail values for each ASIC 104.

If ASIC 104 has failed, the pass/fail bin 109B records the test results for future analysis. The values recorded by logic 109B are stored in memory 110.

Logic 109B also interfaces with an output interface 109C, which generates output 109D, which can be displayed to a user on a display device (not shown). Output 109D can also be transmitted to a user via a network connection (not shown).

Figure 2A:
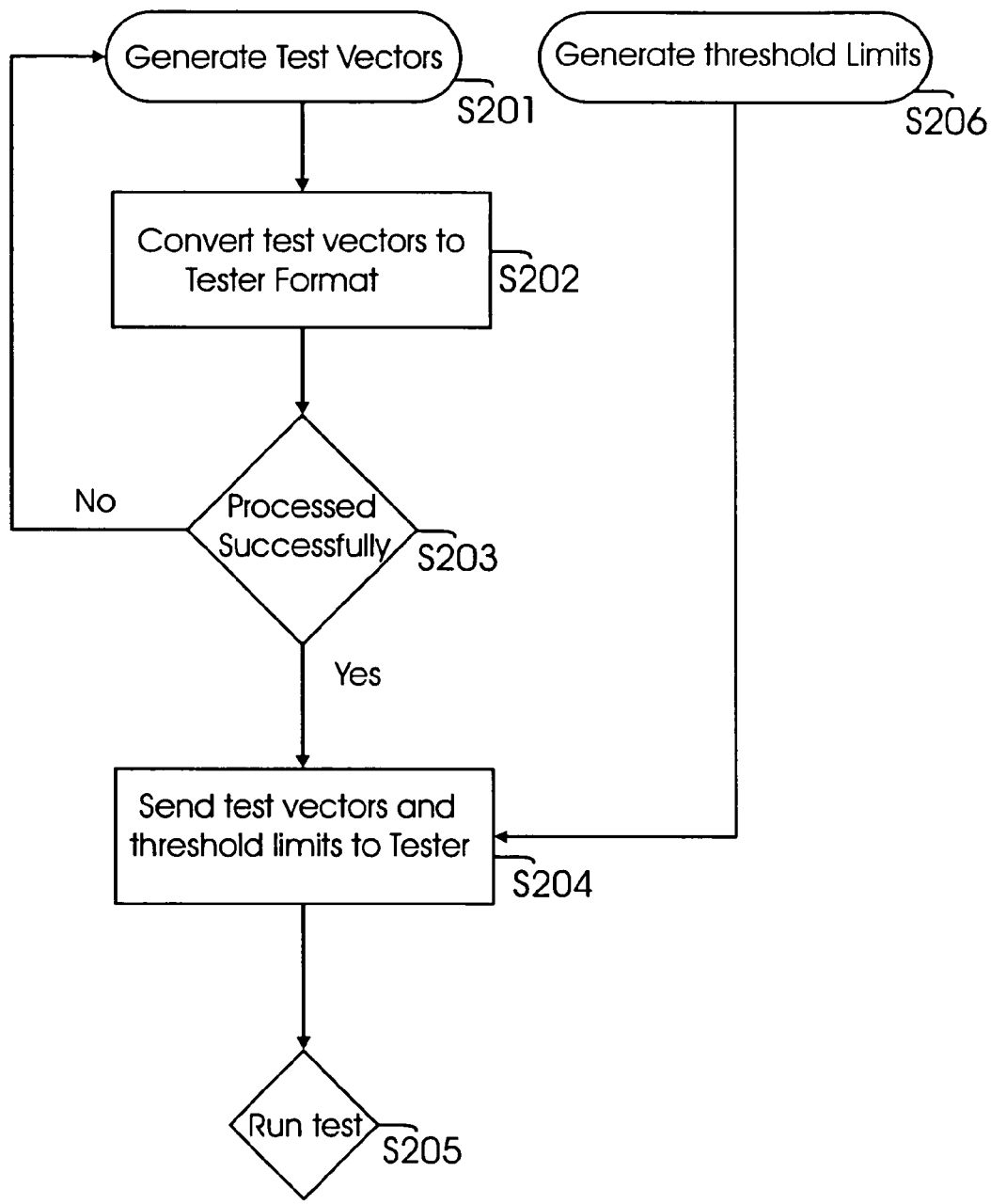
FIG. 2A, shows a flow diagram for generating test vectors and test limits, according to one aspect of the invention.

FIG. 2A, shows a flow diagram for generating test vectors and test limits that are used, according to one aspect of the invention.

The process starts in step S201, when a simulation program for ASIC 104 is used to generate input vectors. Simulation simulates ASIC functionality on a computing system, for example, a general-purpose computer. Various standard simulation tools can be used to run the simulation. For example, simulation tools, NC Verilog marketed by Cadence Corporation and VCS from Synopsys Corporation can be used to run simulation. Simulation output is typically saved in a VCD (value on change dump) format.

In step S202, a software application converts the VCD format file into a format that can be read by tester 100. If the conversion is successful in step S203, then in step S204, the test vectors are stored in tester memory 110 and sent to ASIC 104.

If the conversion is unsuccessful in step S203, then the process reverts back to step S201.

Along with test vectors, pre-defined limits (or threshold values) are also provided to tester 100. The threshold values are determined in step S206. In one aspect, pre-defined limits are calculated using a static timing analysis tool. These limits are stored in tester memory 110 for determining pass/fail criteria after a test is completed as described below with respect to FIG. 2B.

In step S205, ASIC 104 is tested, as described below in detail.

Process Flow Diagram for Measuring Data Set-Up and Data Hold Timing Values

Figure 2B:
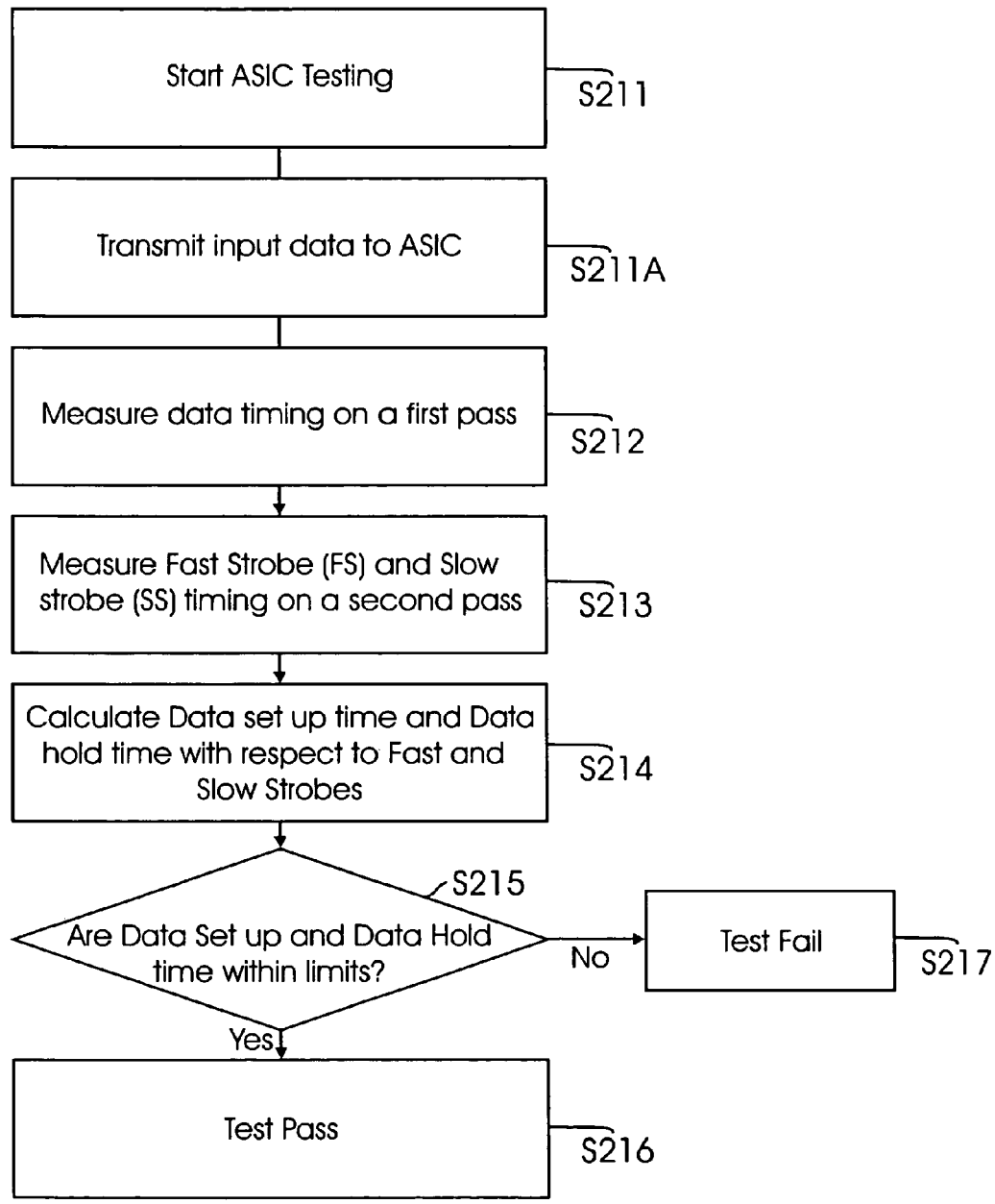
FIG. 2B, shows a process flow diagram for measuring data set-up timing value and data hold timing value, according to one aspect of the invention.

FIG. 2B, shows a two-pass multi-cycle flow diagram for measuring data set-up timing value and data hold timing value, according to one aspect of the invention.

In step S211, ASIC testing starts after the pre-defined limits and test vectors are stored as described above with respect to FIG. 2A. ASIC 104 is typically taken out of a reset condition before starting the test. This is performed by toggling a reset pin (not shown in the figure) that is an input to ASIC 104. This ensures that ASIC 104 is in a known state.

In step S211A, input vectors are read from memory 110. These vectors (also referred to as data 103) are transmitted to ASIC 104 along with a clock signal (or "clock") 103A. Clock 103A typically has the same period and cycle as that of a PCI clock. ASIC 104 logically process data 103 and outputs data 108, first strobe (FSTROBE) 106 and second strobe (SSTROBE) 107.

In step S212, a first pass of data capture is performed. Data processing unit 109 captures data 108 with respect to a tester clock 102. In one aspect, data is captured in 3 cycles of tester clock 102. This is shown in the timing diagram of FIG. 3A.

In the first tester cycle (N) 300 of tester clock 102, data timing (Tval(A)) 301 for data group A (DATA-A) is captured at the positive edge. In the second tester cycle (N+1), data timing (Tval(B)) 302 for data group B (DATA-B) is captured at the negative edge of the tester clock 102. Similarly, in the third tester cycle (N+2), data timing (Tval(C)) 303 for data group C (DATA-C) is captured at the positive edge of the tester clock 102. These values are used in the equations shown below to calculate data set-up time and data hold time values in step S214.

In step S213, a second pass of data capture is performed. Data processing unit 109 captures first strobe 106 and second strobe 107 with respect to tester clock 102. Strobe timing is captured in 3 cycles of the tester clock 102. This is shown in detail with respect to the timing diagram of FIG. 3B.

Figure 3B:
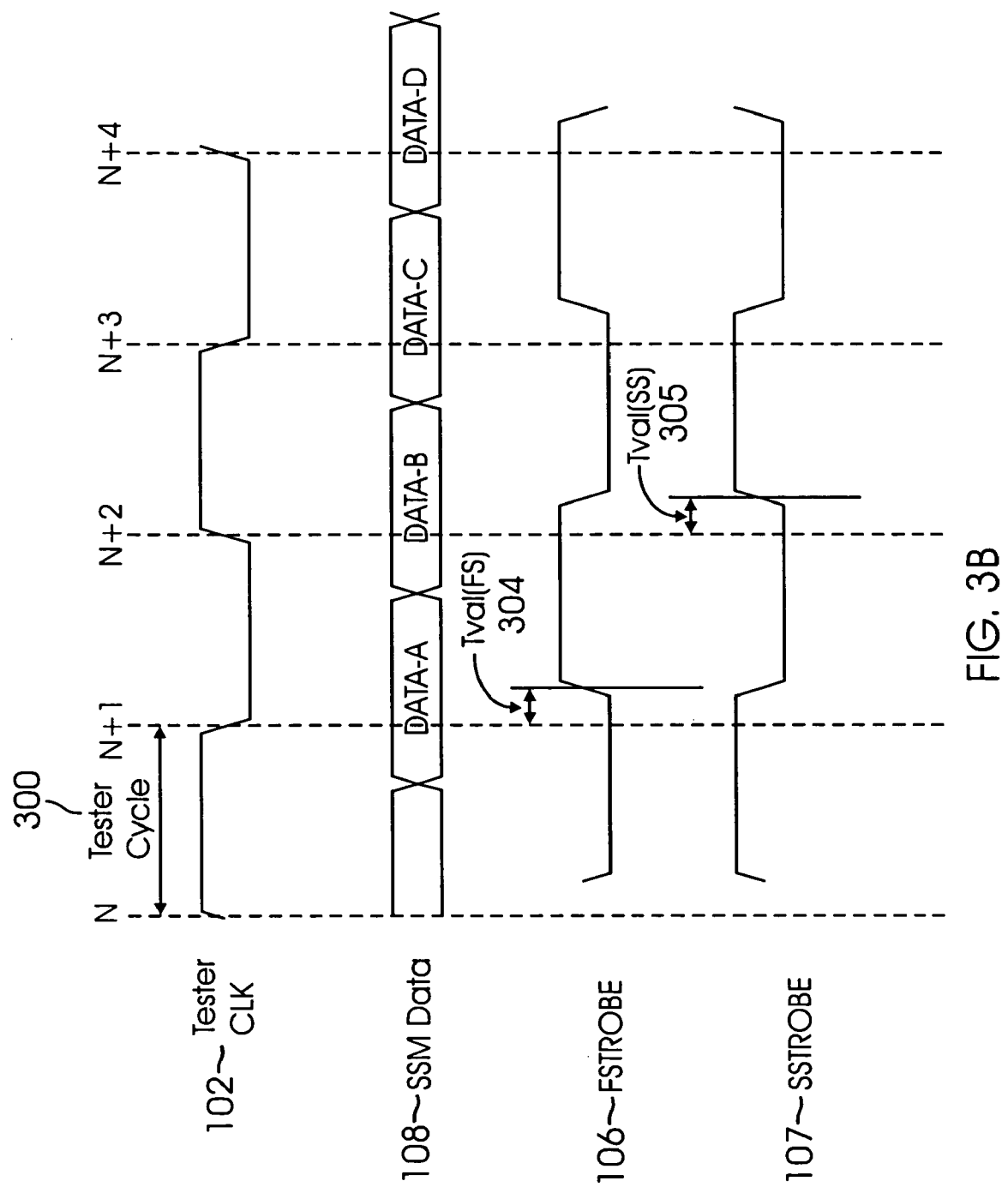
FIG. 3B, is a timing diagram of a PCI-X 2.0 device showing first strobe timing value and second strobe timing value with respect to a tester clock, according to one aspect of the invention.

As shown in FIG. 3B, in the second tester cycle (N+1), first strobe timing (Tval(FS)) 304 is captured at the negative edge of tester clock 102.

In the third tester cycle (N+2), second strobe timing (Tval(SS)) 305 is captured at the positive edge of tester clock 102. These values are used in the equations shown below to calculate data set-up and data hold time values in step S214.

In step S214, data timing values are calculated with respect to the first strobe and second strobe respectively. In one aspect, the calculations use the following equations.

DATA-A setup time with respect to FSTROBE ($T_{idvfh}$):

$$T_{idvfh} = T_{cyc} + Tval(FS) - Tval(A)$$

Where $T_{cyc}$ is half of PCI buc clock cycle.

DATA-A hold time with respect to FSTROBE ($T_{ifhdx}$):

$$T_{ifhdx} = Tval(B) - Tval(FS)$$

DATA-B setup time respect to SSTROBE ($T_{idvsh}$):

$$T_{idvsh} = T_{cyc} + Tval(SS) - Tval(B)$$

DATA-B hold time respect to SSTROBE ($T_{ishdx}$):

$$T_{ishdx} = Tval(C) - Tval(SS)$$

Figure 3C:
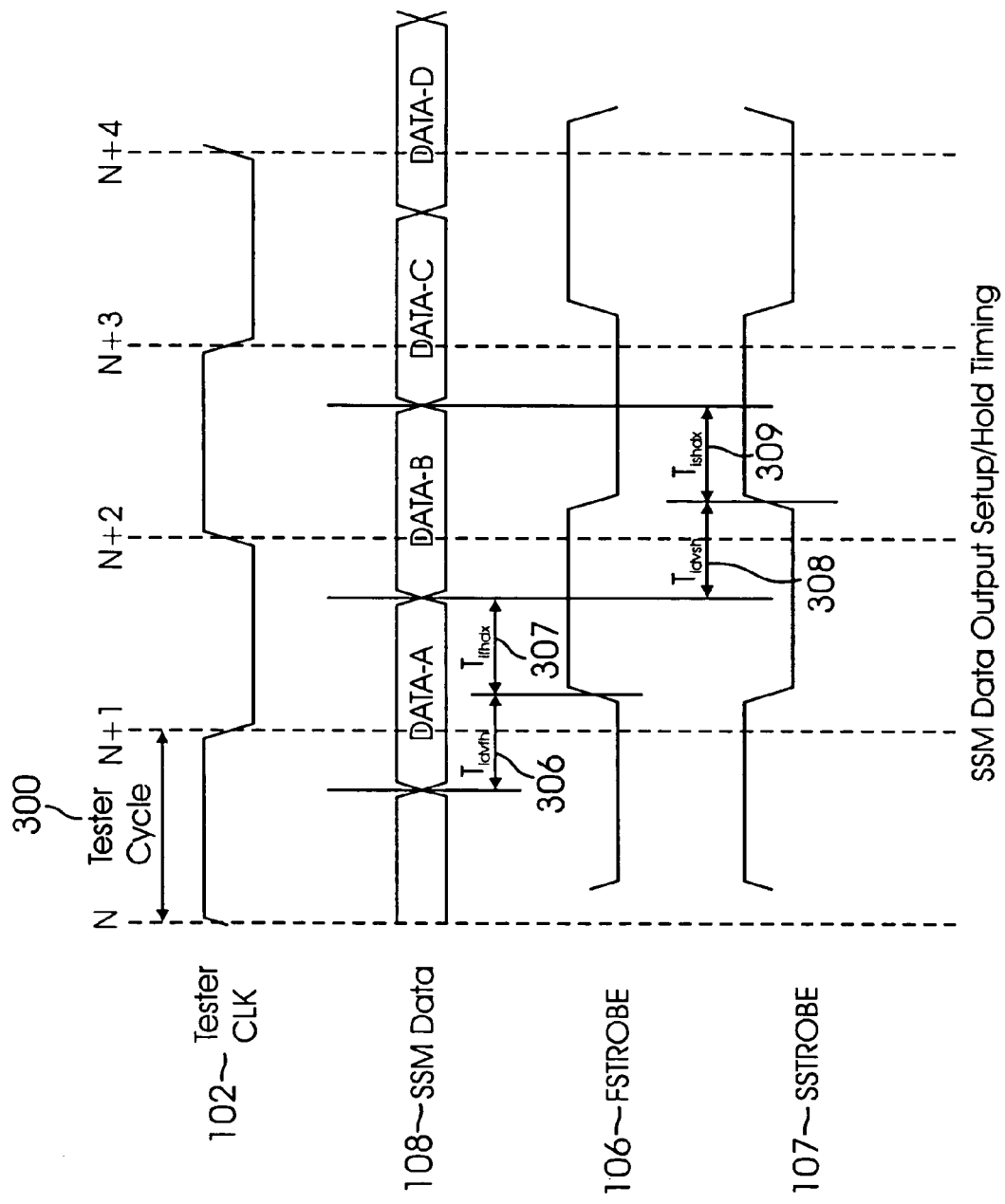
FIG. 3C, is a timing diagram of a PCI-X 2.0 device showing data set-up timing value and data hold timing value with respect to a first strobe and second strobe, according to one aspect of the invention.

FIG. 3C, is a timing diagram of a PCI-X 2.0 device showing data set-up timing value and data hold timing value with respect to the first strobe and second strobe, according to one aspect of the invention. In the first and second pass of the data measurements, tester clock 102 is used as a reference signal. These measurements are used to determine data setup time with respect to FSTROBE ($T_{idvfh}$) (shown as 306), data hold time with respect to FSTROBE ($T_{ifhdx}$) (shown as 307), data setup time with respect to SSTROBE ($T_{idvsh}$) (308) and data hold time with respect to SSTROBE ($T_{ishdx}$) (309).

In step S215, data comparator 109A reads pre-defined threshold values for data set-up and data hold time from memory 110. Data comparator 109A compares the stored values with the data set-up and hold timing values calculated in step S214.

If the values calculated in step S214 are within pre-defined limits, then is step S216 ASIC 104 testing is accepted and the results are stored in memory 110.

If the values calculated in step S214 are outside the pre-defined limits, then is step S217 ASIC 104 testing is considered a failure and the test results are stored in memory 110.

FIG. 3D shows a table with standard PCI-X 2.0 signals/terminology. Column 340 shows FSTROBE 107 values; SSTROBE 108 values are shown in column 341 and column 342 shows SSM data 108 values.

According to one aspect of the present invention, the two-pass multi-cycle approach enables a user to measure data set-up and data hold timing values with respect to a first strobe and second strobe.

Although the present invention has been described with reference to specific embodiments, these embodiments are illustrative only and not limiting. Many other applications and embodiments of the present invention will be apparent in light of this disclosure and the following claims.

What is claimed is:

1. A method for testing an application specific integrated circuit, comprising:
    measuring output data timing values of the application specific integrated circuit operating in a source synchronous mode with respect to a tester cycle transition in a first pass, using a plurality of tester cycles;
    measuring a first strobe timing value and a second strobe timing value of the application specific integrated circuit operating in a source synchronous mode with respect to the tester cycle transition in a second pass, using a plurality of tester cycles; and
    calculating data set-up timing values and data hold timing values with respect to the first strobe and the second strobe, using the output data timing values of the application specific integrated circuit measured with respect to the tester cycle transition in the first pass and the first strobe timing value and second strobe timing value of the application specific integrated circuit measured with respect to the tester cycle transition in the second pass.

2. The method of claim 1, further comprising:
    comparing the data set-up timing values and the data hold timing values to pre-defined limits; wherein if the data set-up timing values and data hold timing values are outside the pre-defined limits then the application specific integrated circuit testing is considered a failure and if the data set-up timing value and data hold timing values are within the pre-defined limits, the application specific integrated circuit testing is accepted.

3. The method of claim 2, wherein the pre-defined limits are stored in a tester memory.

4. The method of claim 1, wherein the output data timing values are stored in a tester memory.

5. The method of claim 1, wherein the first strobe timing values and the second strobe timing values are stored in a tester memory.

6. The method of claim 1, wherein the application specific integrated circuit is a PCI-X 2.0 device.

7. A tester for testing an application specific integrated circuit, comprising:
    an input vector generator that generates input data for the application specific integrated circuit operating in a source synchronous mode that is coupled to a data processing unit that measures output data timing values of the application specific integrated circuit with respect to a tester cycle transition in a first pass, using a plurality of tester cycles; and measures a first strobe timing value and a second strobe timing value of the application specific integrated circuit with respect to the tester cycle transition in a second pass using a plurality of tester cycles; and calculates data set-up timing values and data hold timing values with respect to the first strobe timing value and the second strobe timing value of the application specific integrated circuit, using the output data timing values measured with respect to the tester cycle transition in the first pass and the first strobe timing value and second strobe timing value measured with respect to the tester cycle transition in the second pass.

8. The tester of claim 7, further comprising:
    a data comparator that compares the data set-up timing values and data hold timing values to pre-defined limits; and if the data set-up and hold values are outside the pre-defined limits then testing is a failure and if the data set-up timing values and data hold timing values are within the pre-defined limits then testing is acceptable.

9. The tester of claim 8, wherein the pre-defined limits are stored in a tester memory.

10. The tester of claim 7, wherein the output data timing values are stored in a tester memory.

11. The tester of claim 7, wherein the first strobe timing values and the second strobe timing values are stored in a tester memory.

12. The tester of claim 7, wherein the application specific integrated circuit is a PCI-X 2.0 device.

* * * * *